United States Patent
Wan

(10) Patent No.: US 11,749,347 B2
(45) Date of Patent: Sep. 5, 2023

(54) MEMORY DEVICE WITH PAGE BUFFER CIRCUIT AND PROGRAM OPERATION THEREOF

(71) Applicant: YANGTZE MEMORY TECHNOLOGIES CO., LTD., Wuhan (CN)

(72) Inventor: Weijun Wan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 179 days.

(21) Appl. No.: 17/354,979

(22) Filed: Jun. 22, 2021

(65) Prior Publication Data

US 2022/0392536 A1    Dec. 8, 2022

Related U.S. Application Data

(63) Continuation of application No. PCT/CN2021/097801, filed on Jun. 2, 2021.

(51) Int. Cl.
  *G11C 16/04*    (2006.01)
  *G11C 16/10*    (2006.01)
  (Continued)

(52) U.S. Cl.
  CPC .......... *G11C 16/10* (2013.01); *G11C 11/5628* (2013.01); *G11C 11/5671* (2013.01);
  (Continued)

(58) Field of Classification Search
  CPC . G11C 16/10; G11C 11/5628; G11C 11/5671; G11C 16/0483; G11C 16/08;
  (Continued)

(56) References Cited

U.S. PATENT DOCUMENTS 5,748,535 A    5/1998 Lin et al.
2012/0020155 A1    1/2012 Kim
    (Continued)

FOREIGN PATENT DOCUMENTS

CN    1432920 A    7/2003

OTHER PUBLICATIONS

International Search Report issued in corresponding International Application No. PCT/CN2021/097801, dated Mar. 1, 2022, 4 pages.

*Primary Examiner* — Tha-O H Bui
(74) *Attorney, Agent, or Firm* — BAYES PLLC

(57) ABSTRACT

In certain aspects, a memory device includes an array of memory cells in columns and rows, word lines respectively coupled to rows, bit lines respectively coupled to the columns, and a peripheral circuit coupled to the array of memory cells through the bit lines and the word lines and configured to program a select row based on a current data page. Each memory cell is configured to store a piece of N-bits data at one of $2^N$ levels, where N is an integer greater than 1. The peripheral circuit includes page buffer circuits respectively coupled to the bit lines. Each page buffer circuit includes one cache storage unit, one multipurpose storage unit, and N−1 data storage units.

20 Claims, 11 Drawing Sheets

(51) Int. Cl.
   *G11C 11/56* (2006.01)
   *G11C 16/08* (2006.01)
   *G11C 16/24* (2006.01)
   *G11C 16/34* (2006.01)
   *H10B 41/27* (2023.01)
   *H10B 43/27* (2023.01)

(52) U.S. Cl.
   CPC .......... *G11C 16/0483* (2013.01); *G11C 16/08* (2013.01); *G11C 16/24* (2013.01); *G11C 16/3459* (2013.01); *H10B 41/27* (2023.02); *H10B 43/27* (2023.02)

(58) Field of Classification Search
   CPC ....... G11C 16/24; G11C 16/3459; G11C 5/06; G11C 16/14; H10B 41/27; H10B 43/27; H10B 43/40
   USPC ..................................... 365/185.03
   See application file for complete search history.

(56) References Cited

U.S. PATENT DOCUMENTS

| | | |
|---|---|---|
| 2012/0155180 A1 | 6/2012 | Kawamura et al. |
| 2012/0159072 A1* | 6/2012 | Hida .................. G06F 12/0862 711/119 |
| 2017/0140826 A1* | 5/2017 | Yano ...................... G11C 16/10 |
| 2020/0135270 A1* | 4/2020 | Lee ..................... G06F 12/0246 |

* cited by examiner

MEMORY DEVICE WITH PAGE BUFFER CIRCUIT AND PROGRAM OPERATION THEREOF

CROSS-REFERENCE TO RELATED APPLICATIONS

This application is continuation of International Application No. PCT/CN2021/097801, filed on Jun. 2, 2021, entitled "MEMORY DEVICE AND PROGRAM OPERATION THEREOF," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes an array of memory cells in a plurality of columns and a plurality of rows, a plurality of word lines respectively coupled to rows of the memory cells, a plurality of bit lines respectively coupled to the columns of the memory cells, and a peripheral circuit coupled to the array of memory cells through the bit lines and the word lines and configured to program a select row of the rows of the memory cells based on a current data page. Each memory cell is configured to store a piece of N-bits data at one of $2^N$ levels, where N is an integer greater than 1. The peripheral circuit includes a plurality of page buffer circuits respectively coupled to the bit lines. Each page buffer circuit includes one cache storage unit, one multipurpose storage unit, and N−1 data storage units. The cache storage unit is configured to, in programming the select row based on the current data page, sequentially receive N bits of the current data page and N bits of a next data page, and sequentially store one of the N bits of the current data page and each of the N bits of the next data page. The multipurpose storage unit is configured to, in programming the select row based on the current data page, sequentially store non-data page information and one of the N bits of the next data page. The data storage units each is configured to, in programming the select row based on the current data page, store a respective one of the N bits of the current data page.

In another aspect, a system includes a memory device configured to store data and a memory controller coupled to the memory device and configured to control the memory device. The memory device includes an array of memory cells in a plurality of columns and a plurality of rows, a plurality of word lines respectively coupled to rows of the memory cells, a plurality of bit lines respectively coupled to the columns of the memory cells, and a peripheral circuit coupled to the array of memory cells through the bit lines and the word lines and configured to program a select row of the rows of the memory cells based on a current data page. Each memory cell is configured to store a piece of N-bits data at one of $2^N$ levels, where N is an integer greater than 1. The peripheral circuit includes a plurality of page buffer circuits respectively coupled to the bit lines. Each page buffer circuit includes one cache storage unit, one multipurpose storage unit, and N−1 data storage units. The cache storage unit is configured to, in programming the select row based on the current data page, sequentially receive N bits of the current data page and N bits of a next data page, and sequentially store one of the N bits of the current data page and each of the N bits of the next data page. The multipurpose storage unit is configured to, in programming the select row based on the current data page, sequentially store non-data page information and one of the N bits of the next data page. The data storage units each is configured to, in programming the select row based on the current data page, store a respective one of the N bits of the current data page.

In still another aspect, a method for operating a memory device is provided. The memory device includes a plurality of rows of memory cells. N bits of a current data page are received. One of the N bits of the current data page is stored in one cache storage unit, and a respective one of the N bits of the current data page is stored in each of N−1 data storage units. Non-data page information is stored in one multipurpose storage unit. A select row of the rows of memory cells is programmed based on the current data page. The select row is sequentially verified until the Nth to last level of $2^N$ levels. N bits of a next data page are received. Each of the N bits of the next data page is sequentially stored in the cache storage unit after verifying at a respective one of the last N levels of the $2^N$ levels. One of the N bits of the next data page is stored in the multipurpose storage unit after verifying at the last level of the $2^N$ levels.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
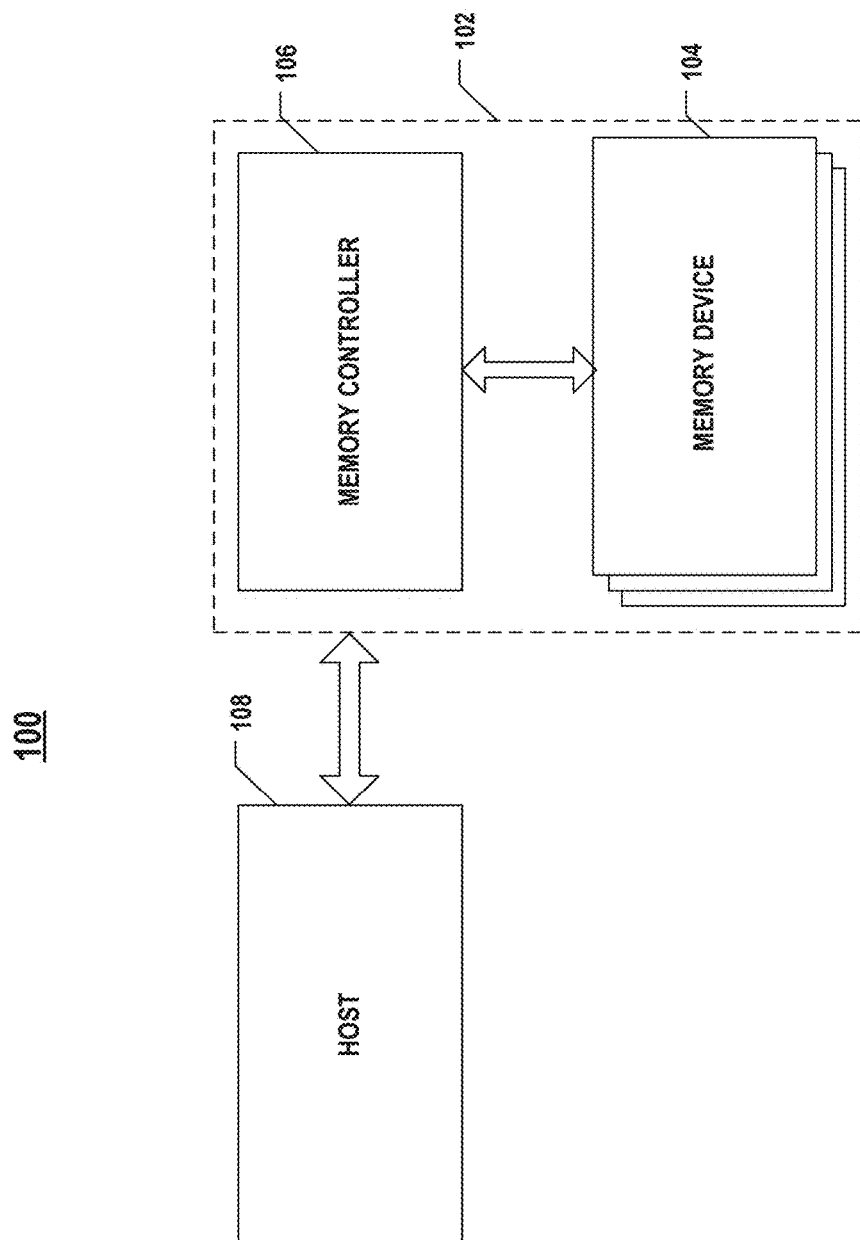
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell in multiple levels (a.k.a., states) in order to increase the storage capacity and reduce the cost per bit. In program operations, the data may be programmed (written) into xLCs, such as multi-level cells (MLCs), trip-level cells (TLCs), quad-level cells (QLCs), etc. For some memory devices having xLCs, a cache program command can be used to allow data insertion for one data page while programming of another data page is currently under execution. To shrink the peripheral circuit size, memory devices usually include only one cache latch for each bit line (BL), which allows only one bit of data (e.g., known as the lower page "LP") from the next data page to be inserted while programming using the current data page. Other bits of data (e.g., the middle page "MP" and upper page "UP") in the next data page need to be inserted after the completion of the current data page program execution. As a result, additional windows between programming adjacent data pages are needed to load portions of the next data page, which affects the performance of sequential program operations, e.g., increasing the program speed.

Although the data loading windows can be reduced or even avoided by some multi-cache data loading schemes that utilize not only the cache latch, but also some data latches, to cache more bits of data from the next data page, those schemes still require at least the same number of data latches as the number of data bits in each xLC (e.g., three data latches for TLCs and four data latches for QLCs) as well as a dedicated cache latch. As the total number of data latches and cache latches increases proportionally as the number of bit lines increases, the size of the page buffer having the latches becomes a major burden in shrinking the memory device size as the memory cell density increases.

To address one or more of the aforementioned issues, the present disclosure introduces a solution that reuses some latches in the page buffer for multi-cache data loading in program operations. As a result, the number of latches needed for each bit line can be further reduced, for example, to 5 latches, while still reducing or even avoiding the data loading windows for sequential program operations. The cache latch can be used not only for caching the next data page, but also for storing part of the current data page, thereby replacing one of the dedicated data latches. In some implementations, to avoid the data loading windows, another latch in the page buffer, for example, a latch for storing the bit line voltage level information, is reused as well to cache part of the next data page at a certain stage while programming using the current data page. Thus, sequential program performance can be improved (e.g., with a fast program speed) without any circuit size cost.

FIG. 1 illustrates a block diagram of a system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as a NAND Flash memory device, can perform a program operation on xLCs (i.e., memory cell configured to store a piece of N-bits data at one of $2^N$ levels, where N is an integer greater than 1) based on a data page having N bits of data for each xLC. Consistent with the scope of the present disclosure, multi-cache data loading schemes can be achieved with a page buffer (e.g., having a 5-latch configuration) of memory device 104 having one cache storage unit (e.g., a cache latch) configured to sequentially store one bit of the current data page and each bit of the next data page, as well as a multipurpose storage unit (e.g., a 3 bit line (BL) latch) configured to sequentially store non-data page information and one bit of the next data page.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
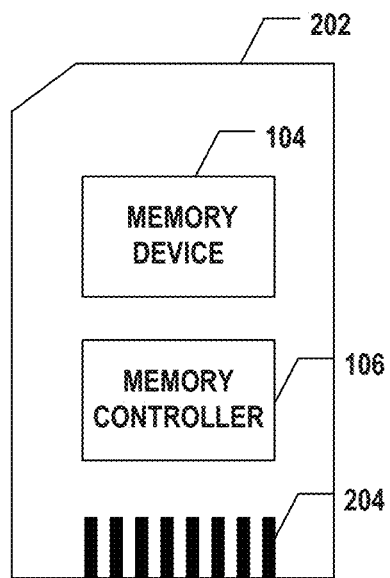
FIG. 2A illustrates a diagram of a memory card having a memory device, according to some aspects of the present disclosure.
Figure 2B:
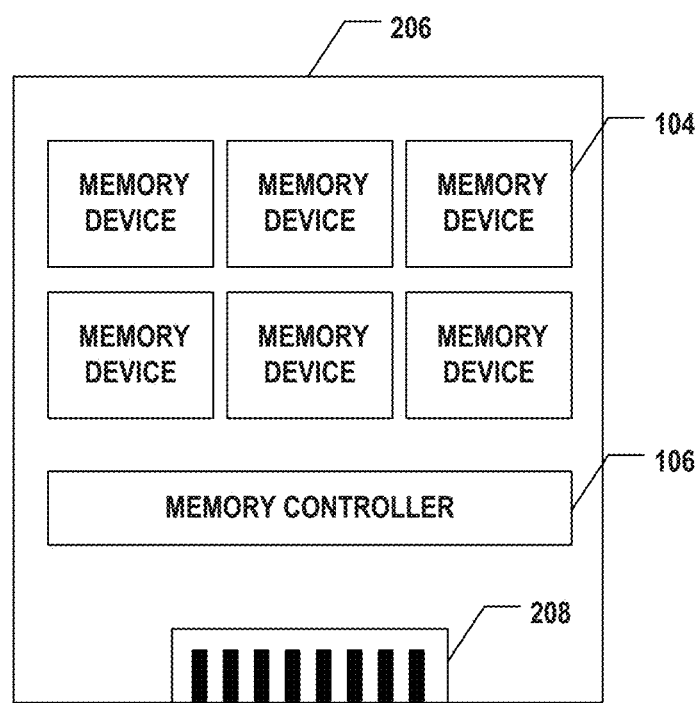
FIG. 2B illustrates a diagram of a solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
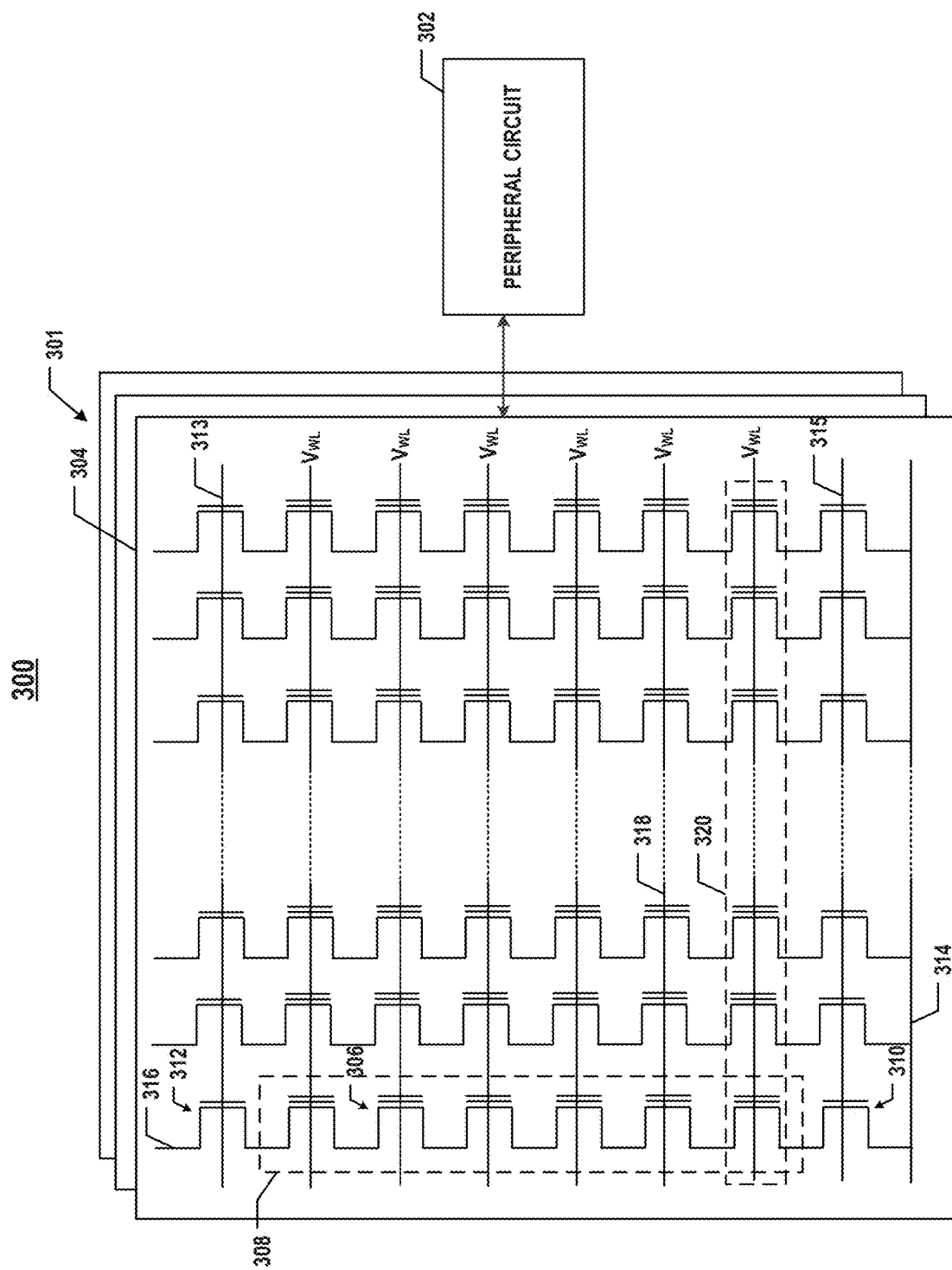
FIG. 3 illustrates a schematic diagram of a memory device including peripheral circuits, according to some aspects of the present disclosure.

FIG. 3 illustrates a schematic circuit diagram of a memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single level cell (SLC) that has two possible memory states (levels) and thus, can store one bit of data. For example, the first memory state "0" can correspond to a first range of threshold voltages, and the second memory state "1" can correspond to a second range of threshold voltages. In some implementations, each memory cell 306 is an xLC that is capable of storing more than a single bit of data in more than four memory states (levels). For example, the xLC may store two bits per cell (MLC), three bits per cell (TLC), or four bits per cell (QLC)). Each xLC can be programmed to assume a range of possible nominal storage values (i.e., $2^N$ pieces of N-bits data, e.g., gray codes). In one example, the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a select voltage or a deselect voltage to the gate of respective DSG transistor 312 through one or more DSG lines 313 and/or by applying a select voltage or a deselect voltage to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive bias voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for read and program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

As shown in FIG. 3, memory cell array 301 can include an array of memory cells 306 in a plurality of rows and a plurality of columns in each block 304. One row of memory cells 306 corresponds to one or more pages 320, and one column of memory cells corresponds to one NAND memory string 308, according to some implementations. The plurality of rows of memory cells 306 can be respectively coupled to word lines 318, and the plurality of columns of memory cells 306 can be respectively coupled to bit lines 316. Peripheral circuit 302 can be coupled to memory cell array 301 through bit lines 316 and word lines 318.

Figure 4:
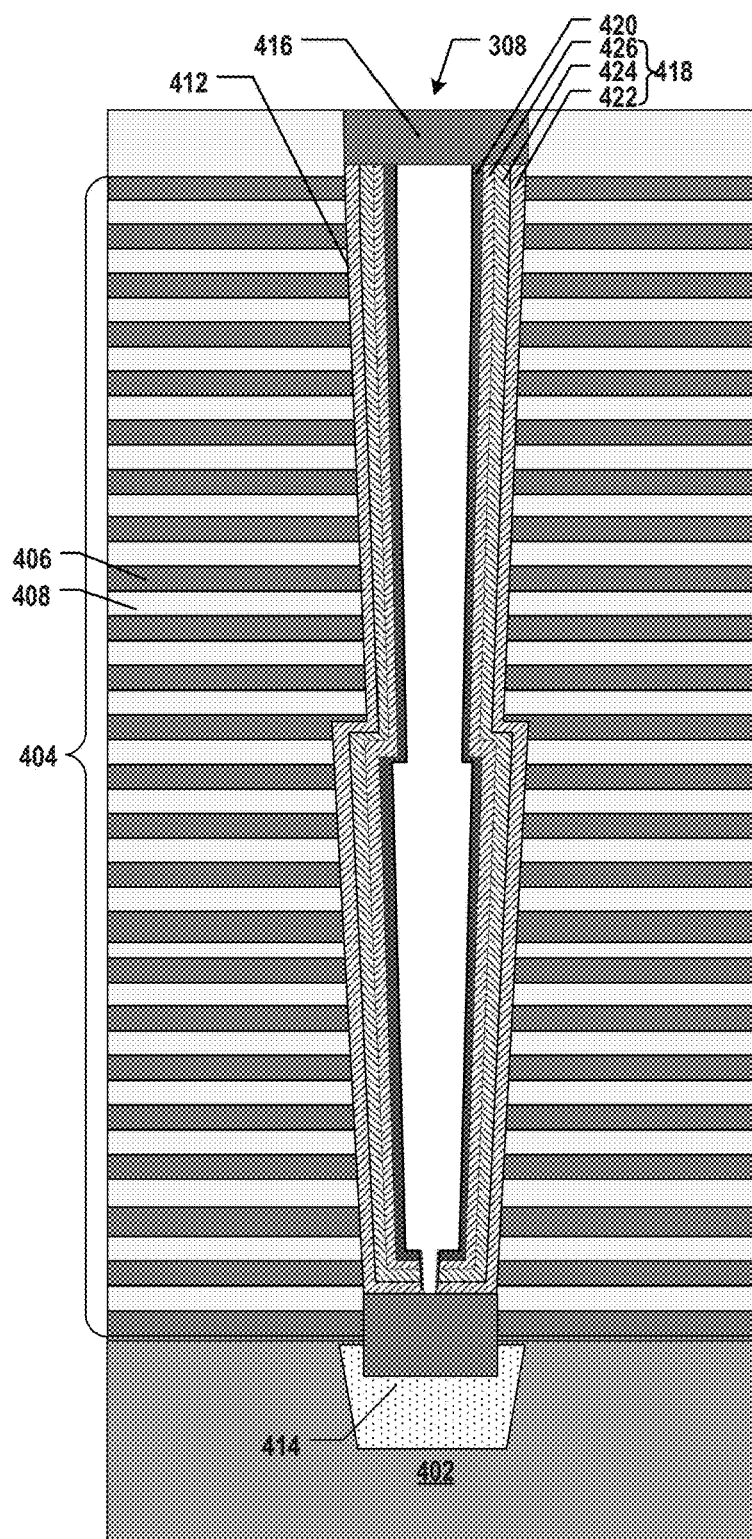
FIG. 4 illustrates a side view of a cross-section of a memory cell array including a NAND memory string, according to some aspects of the present disclosure.

FIG. 4 illustrates a side view of a cross-section of memory cell array 301 including NAND memory string 308, according to some aspects of the present disclosure. As shown in FIG. 4, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/ silicon oxide (ONO).

As shown in FIG. 4, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308. It is understood that although not shown in FIG. 4, additional components of memory cell array 301 can be formed including, but not limited to, gate line slits/source contacts, local contacts, interconnect layers, etc.

Figure 5:
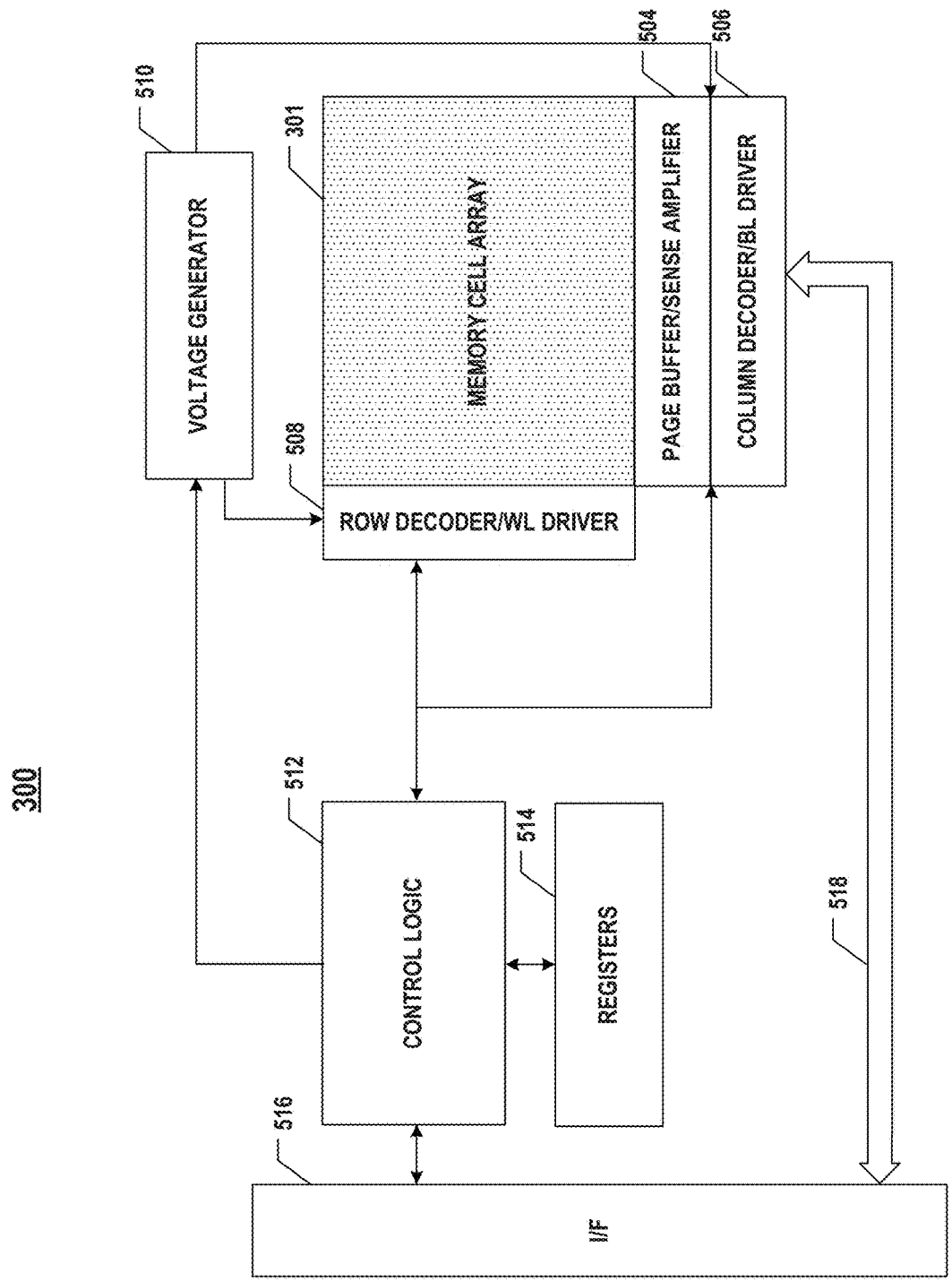
FIG. 5 illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each select memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data, referred to herein as "data page") to be programmed into one page 320 of memory cell array 301. In another example, page buffer/sense amplifier 504 may verify programmed select memory cells 306 in each program/verify loop (cycle) in a program operation to ensure that the data has been properly programmed into memory cells 306 coupled to select word lines 318. In still another example, page buffer/sense amplifier 504 may also sense the low power signals from bit line 316 that represents a data bit stored in memory cell 306 and amplify the small voltage swing to recognizable logic levels in a read operation. As described below in detail and consistent with the scope of the present disclosure, in program operations, page buffer/sense amplifier 504 can include a plurality of page buffer circuits respectively coupled to bit lines 316, and each including a set of storage units (e.g., latches) for temporarily storing a piece of N-bits data (e.g., in the form of gray codes) received from data bus 518 and providing the piece of N-bits data to a corresponding select memory cell 306 through the corresponding bit line 316 in a program operation using a multi-cache loading scheme.

Column decoder/bit line driver 506 can be configured to be controlled by control logic 512 and select one or more NAND memory strings 308 by applying bit line voltages generated from voltage generator 510. Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a memory controller (e.g., 106 in FIG. 1) and/or a host (e.g., 108 in FIG. 1) to control logic 512 and status information received from control logic 512 to the memory controller and/or the host. Interface 516 can also be coupled to column decoder/bit line driver 506 via data bus 518 and act as a data input/output (I/O) interface and a data buffer to buffer and relay the data to and from memory cell array 301.

Figure 6:
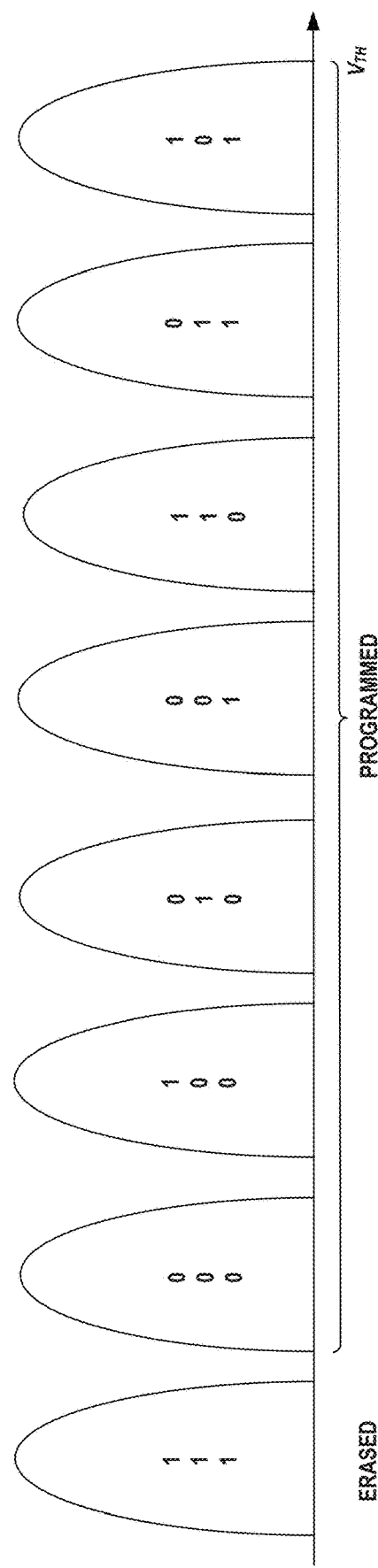
FIG. 6 illustrates threshold voltage distributions of memory cells in a program operation, according to some aspects of the present disclosure.

FIG. 6 illustrates exemplary threshold voltage distributions of memory cells in a program operation, according to some aspects of the present disclosure. As described above, each memory cell 306 can be configured to store a piece of N-bits data in one of $2^N$ levels, where N is an integer greater than 1 (e.g., N=2 for MLCs, N=3 for TLCs, N=4 for QLCs, etc.). Each level can correspond to one of $2^N$ threshold voltage (Vth) ranges of memory cells 306. Taking TLCs, where N=3, for example, as shown in FIG. 6, memory cell 306 may be programmed into one of the 8 levels, including one level of the erased state and 7 levels of the programmed states. Each level may correspond to a respective threshold voltage (Vth) range of memory cells 306. For example, the level corresponding to the lowest threshold voltage range (the left-most threshold voltage distribution in FIG. 6) may be considered as level 0, the level corresponding to the second-lowest threshold voltage range (the second left-most threshold voltage distribution in FIG. 6) may be considered as level 1, and so until level 7 corresponding to the highest threshold voltage range (the right-most threshold voltage distribution in FIG. 6).

On the other hand, each level can correspond to one of the $2^N$ pieces of N-bits data that is to be stored in select memory cell 306. In some implementations, the $2^N$ pieces of N-bits data may be represented by (in the form of) a gray code. A gray code (a.k.a., reflected binary code (RBC) or reflected binary (RB)) is an ordering of the binary numeral system such that two successive values differ in only one bit (binary digit). For example, TABLE 1 below shows an example of a binary code representing a one-to-one mapping between 8 levels (LV 0 to LV 7) and 8 pieces of 3-bits data used in the example of FIG. 6. As shown in TABLE 1, each piece of 3-bits data may consist of three bits of binary values (b1, b2, and b3). In one example, level 1 may correspond to a piece of 3-bits data having a value of 000. In another example, level 7 may correspond to another piece of 3-bits data having a value of 101.

TABLE 1

| LV | 0 | 1 | 2 | 3 | 4 | 5 | 6 | 7 |
|---|---|---|---|---|---|---|---|---|
| b1 | 1 | 0 | 1 | 0 | 0 | 1 | 0 | 1 |
| b2 | 1 | 0 | 0 | 1 | 0 | 1 | 1 | 0 |
| b3 | 1 | 0 | 0 | 0 | 1 | 0 | 1 | 1 |

Also referring to FIG. 5, in a program operation, a data page having N pages (a.k.a. portions) of the N-bits data can be used to program a select row of memory cells 306 coupled to select word line 318. In other words, peripheral circuits 302 can be configured to program a select row of memory cells 306 based on a current data page, which has N pages of the N-bits data. In some implementations, user data is transmitted through data bus 518 to page buffer/sense amplifier 504, and page buffer/sense amplifier 504 is configured to convert the user data into each data page to be programmed into a respective row of memory cells 306 based on a preset gray code. Based on the preset gray code, which defines the mapping of each programmed level and a respective piece of N-bits data, control logic 512 is configured to send control signals (e.g., enable signals) to page buffer/sense amplifier 504 to allow page buffer/sense amplifier 504 to generate sequential data pages for sequential program operations, according to some implementations. Depending on the number N (e.g., whether memory cell 306 is MLC, TLC, QLC, etc.), each data page can include N pages (a.k.a. portions) that can be separately loaded into page buffer/sense amplifier 504 and moved around within page buffer/sense amplifier 504 as described below in detail. During the ongoing program operation, the current data page can be temporarily stored in page buffer/sense amplifier 504, and page buffer/sense amplifier 504 can be configured to provide to each memory cell 306 coupled to select word line 318 the corresponding piece of N-bits data through the corresponding bit line 316.

Figure 7:
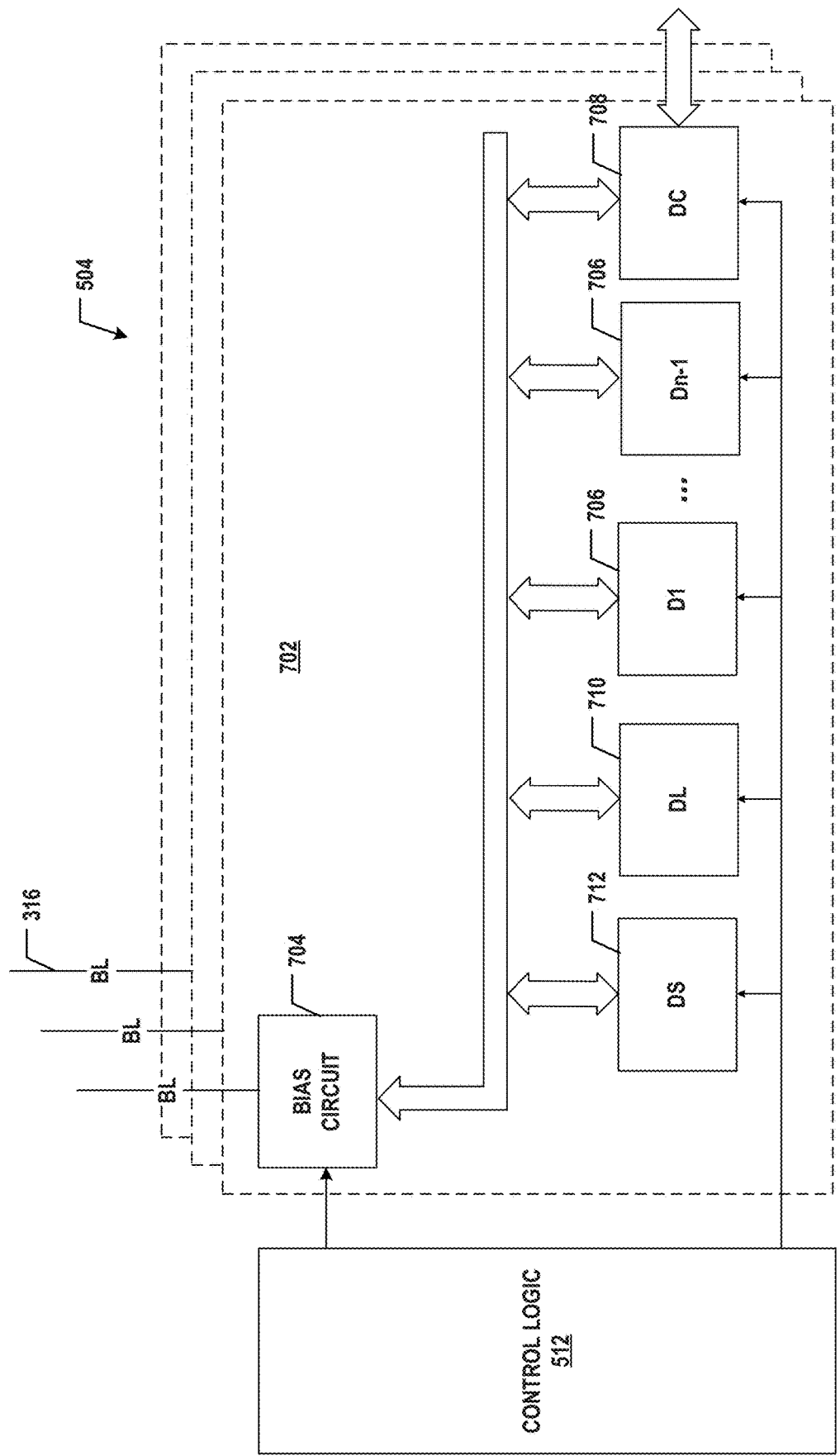
FIG. 7 illustrates a detailed block diagram of a page buffer in a program operation, according to some aspects of the present disclosure.

For example, FIG. 7 illustrates a detailed block diagram of page buffer/sense amplifier 504 in a program operation, according to some aspects of the present disclosure. In some implementations, page buffer/sense amplifier 504 includes a plurality of page buffer circuits 702 each coupled to a respective one of bit lines 316. In other words, each page buffer circuit 702 can be coupled to a respective column of memory cells 306 (e.g., NAND memory string 308) through a corresponding bit line 316 and configured to temporarily store the piece of N-bits data (i.e., the N bits of the current data page) that is used for programming a respective select memory cell 306 (coupled to select word line 318 and the corresponding bit line 316) in a program operation. All page buffer circuits 702 together can temporarily store the N pages of the entire current data page that are used for programming the select row of memory cells 306 (e.g., a page 320 of memory cells 306) coupled to select word line 318 in the program operation. As described above, in some implementations, page buffer circuit 702 is also configured to pre-process a respective portion of the user data received from data bus 518 and convert it to the corresponding N bits of the current data page based on a preset gray code. For example, for TLCs where N=3, each page buffer circuit 702 may be configured to temporarily store a respective one of the 8 sets of 3 bits of the current data page as shown in TABLE 1 above, which correspond to 8 levels, respectively.

In sequential program operations, to reduce or even avoid the data loading windows between adjacent data pages used for programming different rows of memory cells 306, each page buffer circuit 702 can be further configured to cache part or the entirety of the piece of N-bits data (i.e., the N bits of the next data page) that is used for programming a next select memory cell 306 in the next program operation while programming the current select memory cell 306 in the ongoing program operation. All page buffer circuits 702 together can follow a multi-cache data loading scheme to cache one or more of the N pages of the entire next data page that are used for programming the next select row of memory cells 306 (e.g., the next page 320 of memory cells 306) coupled to the next select word line 318 in the current program operation.

Figure 8:
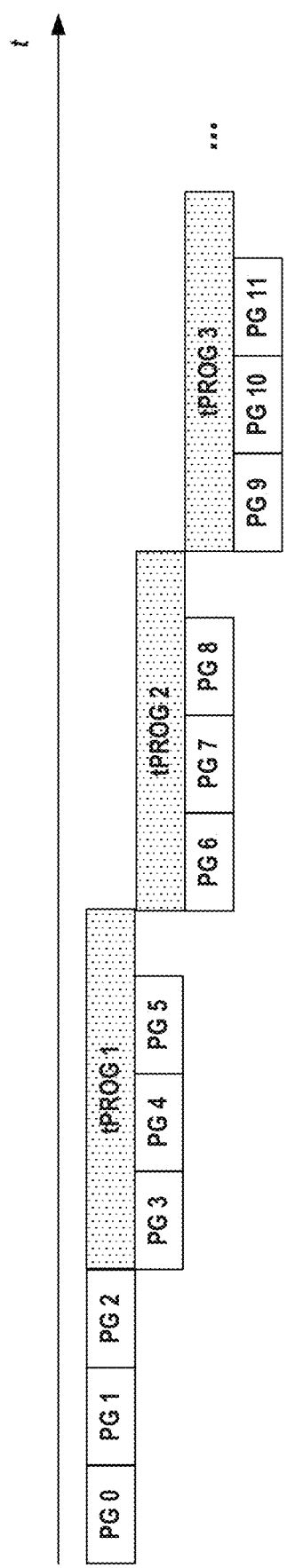
FIG. 8 illustrates a timing diagram of multi-cache data loading in a program operation, according to some aspects of the present disclosure.

For example, FIG. 8 illustrates a timing diagram of multi-cache data loading in a program operation, according to some aspects of the present disclosure. As shown in FIG.

8, still taking TLCs where N=3 as an example, the 3 pages (PG 0, PG 1, and PG 2) of the $1^{st}$ data page may be loaded and stored in page buffer/sense amplifier 504 and used for programming the $1^{st}$ row of memory cells 306. During the time period of programming the $1^{st}$ row of memory cells 306 (tPROG 1), the 3 pages (PG 3, PG 4, and PG 5) of the $2^{nd}$ data page may be loaded and cached in page buffer/sense amplifier 504 as well. In other words, the $2^{nd}$ data page may be ready before the end of tPROG 1, such that the programming of the $2^{nd}$ row of memory cells 306 may start immediately after the programming of the $1^{st}$ row of memory cells 306 without any window for loading the $2^{nd}$ data page. Similarly, during the time period of programming the $2^{nd}$ row of memory cells 306 (tPROG 2), the 3 pages (PG 6, PG 7, and PG 8) of the $3^{rd}$ data page may be loaded and cached in page buffer/sense amplifier 504 as well. As a result, the performance of sequential program operations can be improved by the multi-cache data loading scheme.

Referring back to FIG. 7, to implement the multi-cache data loading scheme for sequential program operations, each page buffer circuit 702 can include a set of data storage units 706 and a cache storage unit (DC) 708. During the current ongoing program operation for programming a select row of memory cells 306 based on a current data page, each data storage unit 706 can be configured to store a respective one of the N bits of the current data page, and cache storage unit 708 can be configured to sequentially store each of the N bits of the next data page (i.e., cache the N bits of the next data page). To reduce the number of storage units and the size of page buffer circuit 702, the number of cache storage unit 708 is limited to one, i.e., a single cache storage unit 708 that can store only a single bit of data at the same time, according to some implementations. Thus, the single cache storage unit 708 is configured to sequentially store each of the N bits of the next data page at different time periods during the current program operation, as described below in detail. Moreover, one or more of data storage units 706 can be configured to store one of the N bits of the next data page as well during the current program operation when the stored bit of the current data page is no longer needed, i.e., performing the cache function as well, due to the limited number (e.g., one) of cache storage unit 708. For example, at least one data storage unit 706 may be configured to sequentially store the respective one of the N bits of the current data page and a respective one of the N bits of the next data page.

Existing multi-cache data loading schemes require the number of data storage units in each page buffer circuit 702 to be at least the same as the number of bits in the piece of data used for programming the corresponding select memory cell 306, i.e., N data storage units because the single cache storage unit is dedicated to caching the data of the next data page. Different from the existing schemes and consistent with the scope of the present disclosure, the single cache storage unit 708 in page buffer circuit 702 in FIG. 7 can also be configured to store one of the N bits of the current data page. That is, cache storage unit 708 is configured to sequentially store one of the N bits of the current data page and each of the N bits of the next data page, according to some implementations. In other words, cache storage unit 708 can act as both a data storage unit and a cache storage unit in a time-division manner to replace one of data storage units 706 in each page buffer circuit 702. In some implementations, as shown in FIG. 7, the number of data storage units 706 in each page buffer circuit 702 thus becomes N−1 (D1 to Dn−1). The total number of data storage units 706 and cache storage unit 708 thus can be reduced from N+1 to N, compared with the existing multi-cache data loading schemes.

It is understood that a total of N data storage units 706 and cache storage unit 708 may reduce the data loading window by caching N−1 bits of the N bits of the next data page in programming the current select row of memory cells based on the current data page, but may not be able to completely avoid the data loading window. Thus, consistent with the scope of the present disclosure, in some implementations, another storage unit in each page buffer circuit 702 for storing non-data page information is configured to sequentially store the non-data page information and one of the N bits of the next data page, thereby enabling the caching of all N−1 bits of the next data page in the current program operation to avoid the data loading windows. That is, page buffer circuit 702 can include a multipurpose storage unit that can store the non-data page information and cache the data of the next data page in a time-division manner.

Each page buffer circuit 702 can include a plurality of storage units for storing non-data page information, i.e., any information other than the data bits in a data page. As shown in FIG. 7, in some implementations, page buffer circuit 702 includes a sensing/program storage unit (DS) 712 configured to store information indicative of whether the current operation performed by page buffer/sense amplifier 504 is a read operation or a program operation, as well as a 3BL storage unit (DL) 710 configured to store the bias information of the respective bit line 316 coupled to page buffer circuit 702. In some implementations, 3BL storage unit 710 is the multipurpose storage unit that acts as both a 3BL storage unit and a cache storage unit in a time-division manner. As shown in FIG. 7, each page buffer circuit 702 can further include a bias circuit 704 coupled to a respective bit line 316 and configured to apply a bit line voltage to corresponding select memory cell 306 coupled to a respective bit line 316 in the program operation. Depending on whether the corresponding select memory cell 306 passes the verification at the respective level according to the N-bits of data for programming the select memory cell 306, for example, a high voltage level and a low voltage level, can be used as the bit line voltage to bias the respective bit line 316. In some implementations, to optimize the threshold voltage distributions (e.g., shown in FIG. 6), for example, enlarging the read margins between adjacent levels and reducing the width of each level, a medium voltage level is used as well for biasing the bit line voltage. That is, three voltage levels, e.g., high, medium, and low, can be applied to the respective bit line 316 (referred to herein as 3BL). In some implementations, a voltage level applied to the respective bit line 316 (e.g., 3BL bias) is the non-data page information stored in 3BL storage unit 710.

It is understood that although 3BL storage unit 710 is described herein as an example of the multipurpose storage unit for implementing the multi-cache data loading scheme disclosed in the present disclosure, any suitable non-data page storage units in page buffer circuit 702, such as sensing/program storage unit 712, or any other non-data page storage units not shown in FIG. 7, may be used as the multipurpose storage unit in some examples without adding additional storage units into page buffer circuit 702. It is also understood that each storage unit in page buffer circuit 702, including each data storage unit 706, cache storage unit 708, 3BL storage unit 710, and sensing/program storage unit 712, may be any circuit that has two stable states for storing a single bit of data, such as a latch or a flip-flop. In one example, each of data storage units 706, cache storage unit 708, 3BL storage unit 710, and sensing/program storage unit 712 may include a latch. In some implementations, page buffer circuit 702 has a 5-latch configuration that includes one cache latch, two data latches, one 3 BL latch, and one sensing/program latch. In some implementations, cache storage unit 708 includes the one cache latch, data storage units 706 include the two data latches, and the multipurpose storage unit includes the one 3 BL latch.

Figure 9A:
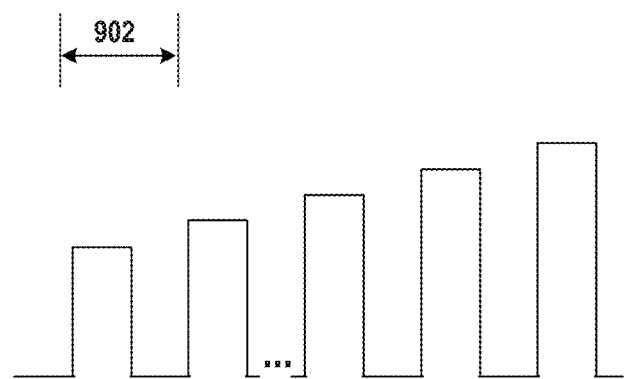
FIGS. 9A and 9B illustrate a waveform of word line voltages applied to a select word line in a program operation, according to some aspects of the present disclosure.
Figure 9B:
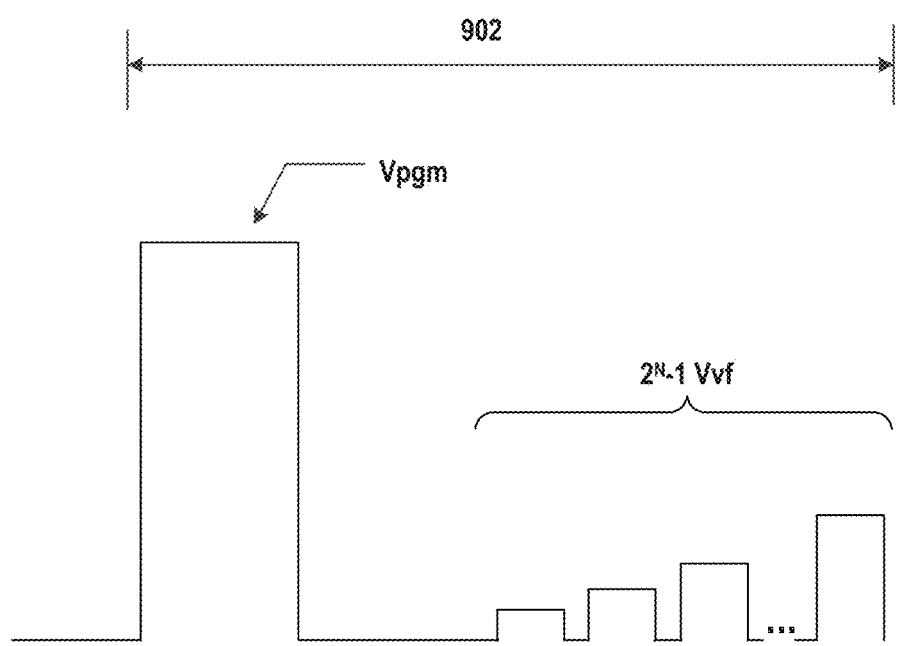

To perform a program operation, in addition to page buffer/sense amplifier 504 providing to each select memory cell 306 the corresponding piece of N-bits data, row decoder/word line driver 508 can be configured to apply program voltages and verify voltages to a select word line 318 coupled to a select row of memory cells 306 in one or more program/verify loops in order to raise the threshold voltage of each select memory cell 306 to a desired level (into a desired range of threshold voltages) based on the corresponding piece of N-bits data. For example, FIGS. 9A and 9B illustrate a waveform of word line voltages applied to a select word line in a program operation. As shown in FIG. 9A, the program operation includes one or more program/verify loops (cycles) 902. As shown in FIG. 9B, in each program/verify loop 902, row decoder/word line driver 508 can be configured to apply a program voltage (Vpgm) on select word line 318 and sequentially apply $2^N-1$ verify voltages (Vvf) with incremental changes of voltage levels. The $2^N-1$ verify voltages can correspond to $2^N-1$ levels of the $2^N$ levels (e.g., the $2^N-1$ programmed levels except for one erased level). That is, peripheral circuit 302 can be configured to sequentially verify the select row of memory cells 306 at the $2^N-1$ levels of the $2^N$ levels. Each select memory cell 306 can be programmed into one of the $2^N$ levels based on the corresponding N bits of data to be stored in select memory cell 306, i.e., the N bits of the current data page stored in the corresponding page buffer circuit 702. Still taking TLCs where N=3 as an example, select memory cells 306 may be sequentially programmed into one of 8 levels (e.g., shown in FIG. 6) by applying 7 verify voltages each corresponding to one of the 7 programmed levels.

Figure 11:
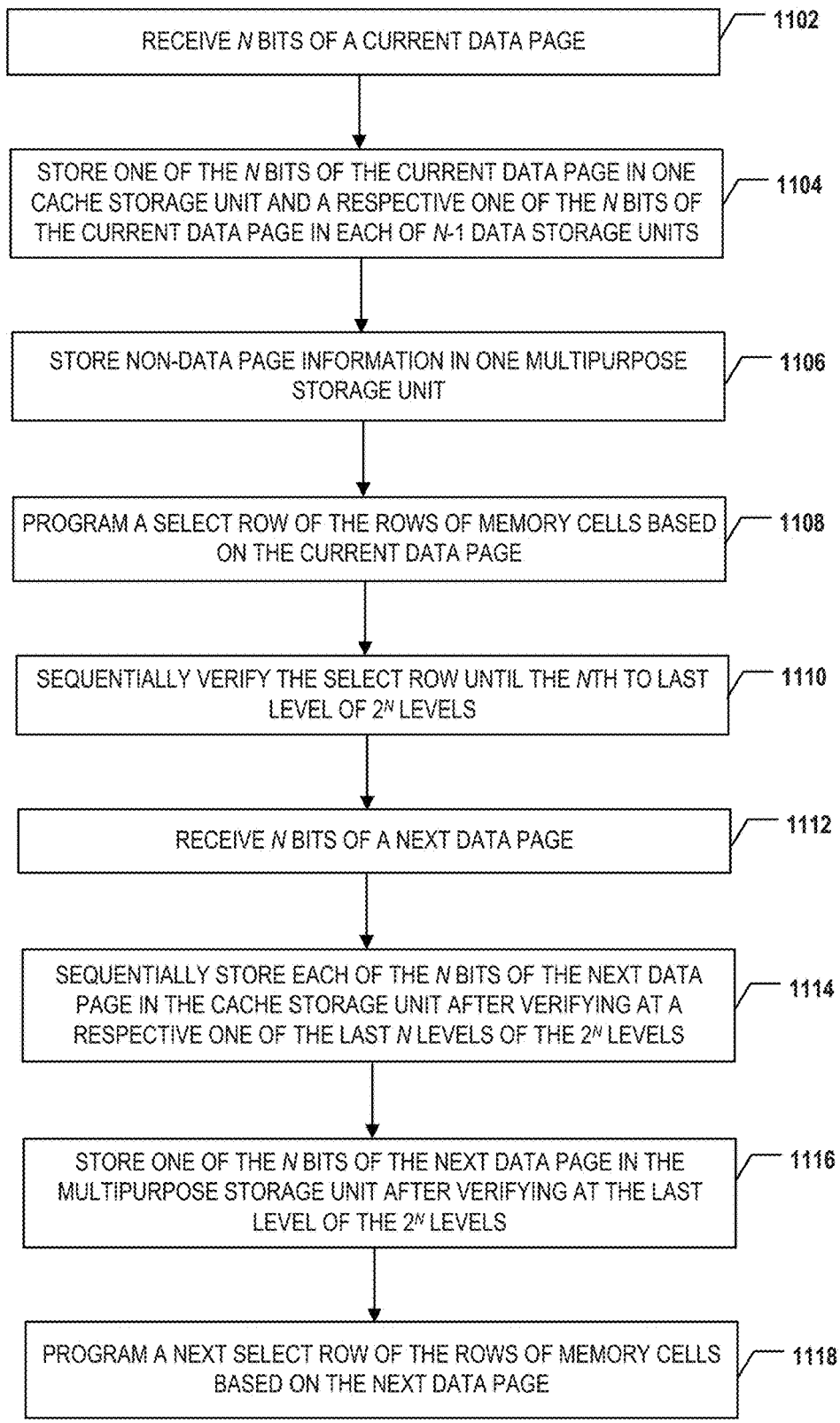
FIG. 11 illustrates a flowchart of a method for operating a memory device, according to some aspects of the present disclosure.

Multi-cache data loading schemes implemented based on memory devices disclosed herein (e.g., memory device 300 including page buffer circuits 702) are described below in detail. For example, FIG. 11 illustrates a flowchart of a method 1100 for operating a memory device, according to some aspects of the present disclosure. The memory device may be any suitable memory device disclosed herein, such as memory device 300. Method 1100 may be implemented by peripheral circuit 302, such as row decoder/word line driver 508 and page buffer/sense amplifier 504. It is understood that the operations shown in method 1100 may not be exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which N bits of a current data page are received in programming a select row of memory cells. For example, as shown in FIG. 7, control logic 512 may send control signals to cache storage unit 708 of each page buffer circuit 702 to control cache storage unit 708 to sequentially receive data pages each having N bits of data in sequential program operations. In the current program operation, i.e., programming a select row of memory cells 306 coupled to a select word line 318 based on a current data page, cache storage unit 708 may be configured to sequentially receive N bits of the current data page and N bits of the next data page immediately following the current data page.

Method 1100 proceeds to operation 1104, as illustrated in FIG. 11, in which one of the N bits of the current data page is stored in one cache storage unit, and a respective one of the N bits of the current data page is stored in each of N−1 data storage units. For example, as shown in FIG. 7, control logic 512 may send control signals to the single cache storage unit 708 and the set of N−1 data storage units 706 of each page buffer circuit 702 to control the single cache storage unit 708 and N−1 data storage units 706 to store the N bits of the current data page, respectively. In other words, cache storage unit 708 may first act as a data storage unit as well, such that a total number of N data storage units may store the N bits of the current data page, respectively. In one example, cache storage unit 708 may be configured to store the one of the N bits of the current data page before verifying at the Nth to last level of the $2^N$ levels, and at least one data storage unit 706 may be configured to store the respective one of the N bits of the current data page before verifying at the (N−1)th to last level of the $2^N$ levels.

Method 1100 proceeds to operation 1106, as illustrated in FIG. 11, in which non-data page information is stored in one multipurpose storage unit. The non-data page information can include a voltage level applied to the respective bit line. For example, as shown in FIG. 7, control logic 512 may send control signals to the single 3BL storage unit 710 to control the single 3BL storage unit 710 to store bit line bias information, e.g., one of the three voltage levels applied to the respective bit line 316. In one example, 3BL storage unit 710 may be configured to store the non-data page information before verifying the last level of the $2^N$ levels.

Method 1100 proceeds to operation 1108, as illustrated in FIG. 11, in which a select row of memory cells is programmed based on the current data page. For example, as shown in FIGS. 5 and 9B, control logic 512 may send control signals to row decoder/word line driver 508 to apply a program voltage (Vpgm) to a select word line 318 coupled to a select row of memory cells 306.

Method 1100 proceeds to operation 1110, as illustrated in FIG. 11, in which the select row is sequentially verified until the Nth to last level of $2^N$ levels. For example, as shown in FIGS. 5 and 9B, control logic 512 may send control signals to page buffer/sense amplifier 504 to sequentially apply $2^N-1$ verify voltages (Vvf) on select word line 318. The $2^N-1$ verify voltages can correspond to the $2^N-1$ levels of the $2^N$ levels. For example, for TLCs where N=3, the 7 verify voltages may respectively correspond to the 7 pieces of 3-bit data each corresponding to a respective level of the 7 programmed levels (LV 1 to LV 7) of the 8 levels, as shown in TABLE 1 above.

Figure 10:
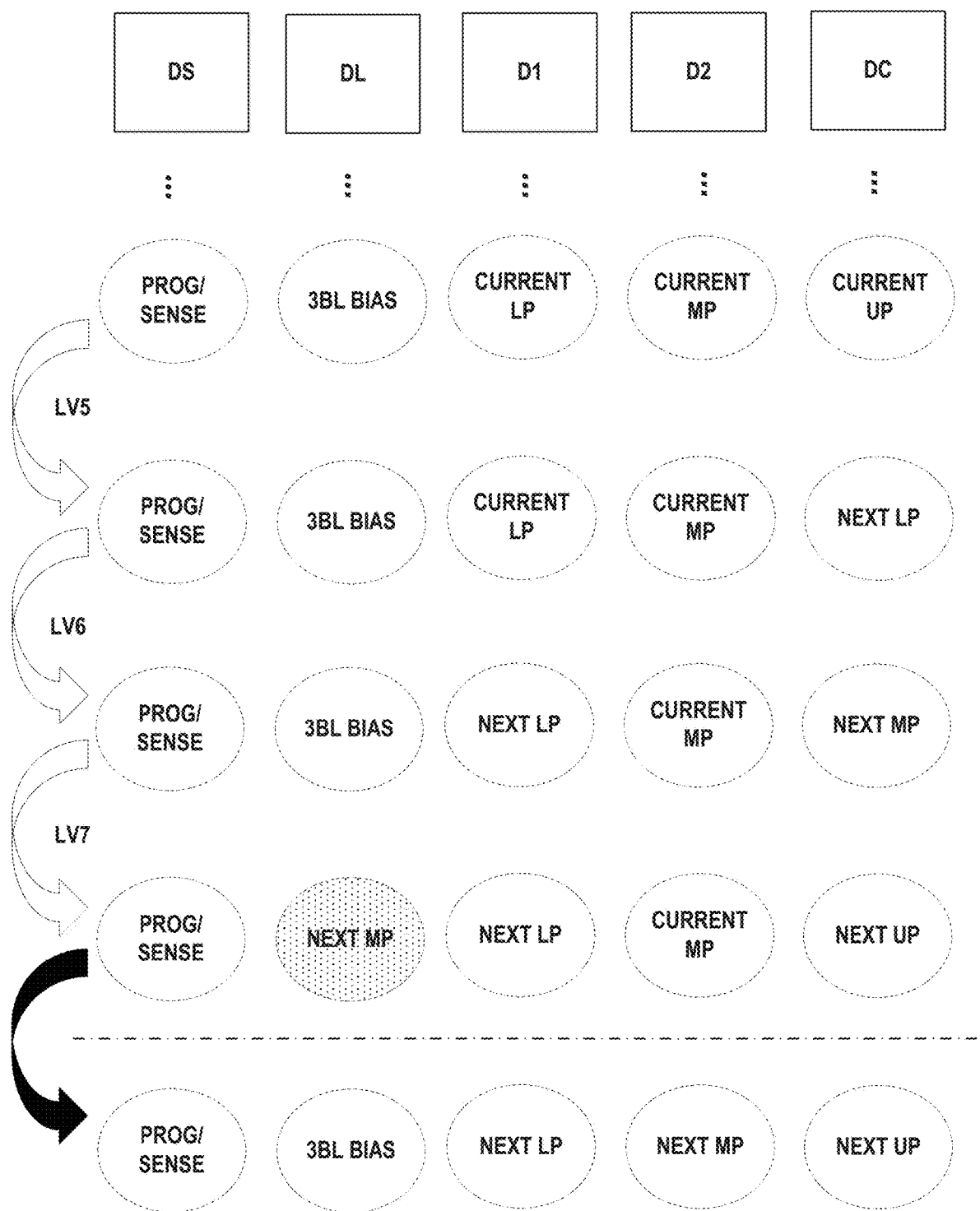
FIG. 10 illustrates a scheme of multi-cache data loading in a program operation, according to some aspects of the present disclosure.

Still taking TLCs where N=3 as an example, as shown in FIG. 10, before verifying at the $3^{rd}$ to last level of the 8 levels, i.e., the $6^{th}$ level (LV5), the cache storage unit (DC) may store one of the 3 bits of the current data page (current UP), and the $1^{st}$ data storage unit (D1) may store the respective bit of the current data page (current LP), and the $2^{nd}$ data storage unit (D2) may store the respective bit of the current data page (current MP). The verification at each of the $1^{st}$ level (LV0) to the $5^{th}$ level (LV4) may follow the gray code as shown in TABLE 1 before based on the 3 bits of data stored in DC, D1 and D2, e.g., 111 for LV0, and 001 for LV4, where b1, b2, and b3 may correspond to LP, MP, and UP, respectively. Other storage units may store non-data page information. For example, the 3BL storage unit (DL) may store the voltage level applied to the respective bit line (3BL bias), and the sensing/program storage unit (DS) may store the program or read operation information, e.g., indicating that the current operation is a program operation.

Method 1100 proceeds to operation 1112, as illustrated in FIG. 11, in which N bits of a next data page is received. For example, during the current program operation, page buffer circuits 702 may start to cache the next data page for the next program operation by sequentially receiving the N bits of the next data page at cache storage unit 708. Method 1100 proceeds to operation 1114, as illustrated in FIG. 11, in which each of the N bits of the next data page is sequentially stored in the cache storage unit after verifying at a respective one of the last N levels of the $2^N$ levels. In some implementations, the respective one of the N bits of the current data page is stored in one of the data storage units before verifying at the (N−1)th to last level of the $2^N$ levels. In some implementations, a respective one of the N bits of the next data page is stored in the data storage unit after verifying at the (N−1)th to last level of the $2^N$ levels.

For example, as shown in FIG. 10, DC may sequentially store each of the 3 bits of the next data page (next LP, next MP, and next UP) after verifying at a respective one of the last 3 levels (LV 5, LV 6, and LV 7). D1 may store the respective bit of the current data page (current LP) before verifying at the $2^{nd}$ to last level, i.e., the $7^{th}$ level (LV6), and then store a respective bit of the next data page (next LP) after verifying at the $2^{nd}$ to last level, i.e., LV 6. D2 may store the respective bit of the current data page (current MP) when verifying at each level.

After verifying at the $3^{rd}$ to last level of the 8 levels, i.e., the $6^{th}$ level (LV5) has been verified, the binary code of TABLE 1 may be updated as shown in TABLE 2 below where all the data bits in LV0 to LV 5 may be updated to 1 as they are no longer needed in the current program operation. As shown in TABLE 2, since b3 in the last two levels LV 6 and LV7 is always 1, DC that is used for storing the bit of b3 (current UP) may be no longer needed and thus, may be reused for caching the data bits of the next data page. For example, as shown in FIG. 10, after verifying at LV5, DC may be released to replace current UP with the first bit of the next data page (next LP).

TABLE 2

| LV | 0 | 1 | 2 | 3 | 4 | 5 | 6 | 7 |
|----|---|---|---|---|---|---|---|---|
| b1 | 1 | 1 | 1 | 1 | 1 | 1 | 0 | 1 |
| b2 | 1 | 1 | 1 | 1 | 1 | 1 | 1 | 0 |
| b3 | 1 | 1 | 1 | 1 | 1 | 1 | 1 | 1 |

After verifying at the $2^{nd}$ to last level of the 8 levels, i.e., the $7^{th}$ level (LV6) has been verified, the binary code of TABLE 2 may be updated as shown in TABLE 3 below where all data bits in LV 6 may be updated to 1 as they are no longer needed in the current program operation. As shown in TABLE 3, since only b2 in the last level LV 7 is 0, D1 that is used for storing the bit of b1 (current LP) may be no longer needed and thus, may be reused for caching a data bit of the next data page. For example, as shown in FIG. 10, after verifying at LV6, D1 may be released to replace current LP with the first bit of the next data page (next LP), such that DC may be released again to cache the second bit of the next data page (next MP). That is, next LP may be transferred from DC to D1 after verifying at LV 6, and next MP may be cached in DC.

TABLE 3

| LV | 0 | 1 | 2 | 3 | 4 | 5 | 6 | 7 |
|----|---|---|---|---|---|---|---|---|
| b1 | 1 | 1 | 1 | 1 | 1 | 1 | 1 | 1 |
| b2 | 1 | 1 | 1 | 1 | 1 | 1 | 1 | 0 |
| b3 | 1 | 1 | 1 | 1 | 1 | 1 | 1 | 1 |

Method 1100 proceeds to operation 1116, as illustrated in FIG. 11, in which one of the N bits of the next data page is stored in the multipurpose storage unit after verifying at the last level of the $2^N$ levels. For example, as shown in FIG. 10, DL may store 3BL bias before verifying at the last level, i.e., the $8^{th}$ level (LV7), and then store one bit of the next data page (next MP) after verifying at LV7. In some implementations, after verifying at the last level, 3BL bias may be no longer needed, for example, as the read margin and distribution width of the last level may be less critical compared with other levels. Thus, DL may be released to replace 3BL bias with the second bit of the next data page (next MP), such that DC may be released again to cache the third bit of the next data page (next UP). That is, next MP may be transferred from DC to DL after verifying at LV 7, and next UP may be cached in DC.

Method 1100 proceeds to operation 1118, as illustrated in FIG. 11, in which a next select row of the rows of memory cells is programmed based on the next data page. As shown in FIG. 10, since all 3 bits of the next data page (next LP, next MP, and next UP) may be cached after verifying at LV 7, the next data page may become ready during the current program operation. Thus, at the end of the current program operation, the next program operation based on the next data page may be seamlessly triggered without a data loading window. For example, during the transition, next MP may be transferred from DL to D2, such that the 3 bits of the next data page (next LP, next MP, and next UP) may be stored in D1, D2, and DC, respectively, for the next program operation, and DL may be released again to store 3BL bias for the next program operation as well.

According to one aspect of the present disclosure, a memory device includes an array of memory cells in a plurality of columns and a plurality of rows, a plurality of word lines respectively coupled to rows of the memory cells, a plurality of bit lines respectively coupled to the columns of the memory cells, and a peripheral circuit coupled to the array of memory cells through the bit lines and the word lines and configured to program a select row of the rows of the memory cells based on a current data page. Each memory cell is configured to store a piece of N-bits data at one of $2^N$ levels, where N is an integer greater than 1. The peripheral circuit includes a plurality of page buffer circuits respectively coupled to the bit lines. Each page buffer circuit includes one cache storage unit, one multipurpose storage unit, and N−1 data storage units. The cache storage unit is configured to, in programming the select row based on the current data page, sequentially receive N bits of the current data page and N bits of a next data page, and sequentially store one of the N bits of the current data page and each of the N bits of the next data page. The multipurpose storage unit is configured to, in programming the select row based on the current data page, sequentially store non-data page information and one of the N bits of the next data page. The data storage units each is configured to, in programming the select row based on the current data page, store a respective one of the N bits of the current data page.

In some implementations, the non-data page information includes a voltage level applied to the respective bit line.

In some implementations, to program the select row based on the current data page, the peripheral circuit is configured to sequentially verify the select row at $2^N-1$ levels of the $2^N$ levels.

In some implementations, the cache storage unit is configured to store the one of the N bits of the current data page before verifying at the Nth to last level of the $2^N$ levels, and sequentially store each of the N bits of the next data page after verifying at a respective one of the last N levels of the $2^N$ levels.

In some implementations, the multipurpose storage unit is configured to store the non-data page information before verifying at the last level of the $2^N$ levels, and store the one of the N bits of the next data page after verifying at the last level of the $2^N$ levels.

In some implementations, at least one of the data storage units is configured to sequentially store the respective one of the N bits of the current data page and a respective one of the N bits of the next data page.

In some implementations, one of the at least one of the data storage units is configured to store the respective one of the N bits of the current data page before verifying at the (N−1)th to last level of the $2^N$ levels, and store the respective one of the N bits of the next data page after verifying at the (N−1)th to last level of the $2^N$ levels.

In some implementations, the peripheral circuit further comprises a word line driver coupled to the word lines and configured to apply a program voltage on a select word line of the word lines coupled to the select row, and sequentially apply $2^N-1$ verify voltages on the select word line, the $2^N-1$ verify voltages corresponding to the $2^N-1$ levels of the 2 levels.

In some implementations, each of the cache storage unit, the multipurpose storage unit, and the data storage units includes a latch.

In some implementations, the peripheral circuit is further configured to program a next select row of the rows of memory cells based on the next data page after programming the select row based on the current data page.

In some implementations, the page buffer circuit includes one cache latch, two data latches, one 3 bit line latch, and one sensing/program latch.

In some implementations, the one cache storage unit includes the one cache latch, the N−1 data storage units includes the two data latches, and the multipurpose storage unit includes the 3 bit line latch.

According to another aspect of the present disclosure, a system includes a memory device configured to store data and a memory controller coupled to the memory device and configured to control the memory device. The memory device includes an array of memory cells in a plurality of columns and a plurality of rows, a plurality of word lines respectively coupled to rows of the memory cells, a plurality of bit lines respectively coupled to the columns of the memory cells, and a peripheral circuit coupled to the array of memory cells through the bit lines and the word lines and configured to program a select row of the rows of the memory cells based on a current data page. Each memory cell is configured to store a piece of N-bits data at one of $2^N$ levels, where N is an integer greater than 1. The peripheral circuit includes a plurality of page buffer circuits respectively coupled to the bit lines. Each page buffer circuit includes one cache storage unit, one multipurpose storage unit, and N−1 data storage units. The cache storage unit is configured to, in programming the select row based on the current data page, sequentially receive N bits of the current data page and N bits of a next data page, and sequentially store one of the N bits of the current data page and each of the N bits of the next data page. The multipurpose storage unit is configured to, in programming the select row based on the current data page, sequentially store non-data page information and one of the N bits of the next data page. The data storage units each is configured to, in programming the select row based on the current data page, store a respective one of the N bits of the current data page.

In some implementations, the non-data page information includes a voltage level applied to the respective bit line.

In some implementations, to program the select row based on the current data page, the peripheral circuit is configured to sequentially verify the select row at $2^N-1$ levels of the $2^N$ levels.

In some implementations, the cache storage unit is configured to store the one of the N bits of the current data page before verifying at the Nth to last level of the $2^N$ levels, and sequentially store each of the N bits of the next data page after verifying at a respective one of the last N levels of the $2^N$ levels.

In some implementations, the multipurpose storage unit is configured to store the non-data page information before verifying at the last level of the $2^N$ levels, and store the one of the N bits of the next data page after verifying at the last level of the $2^N$ levels.

In some implementations, at least one of the data storage units is configured to sequentially store the respective one of the N bits of the current data page and a respective one of the N bits of the next data page.

In some implementations, one of the at least one of the data storage units is configured to store the respective one of the N bits of the current data page before verifying at the (N−1)th to last level of the $2^N$ levels, and store the respective one of the N bits of the next data page after verifying at the (N−1)th to last level of the $2^N$ levels.

In some implementations, the peripheral circuit further comprises a word line driver coupled to the word lines and configured to apply a program voltage on a select word line of the word lines coupled to the select row, and sequentially apply $2^N-1$ verify voltages on the select word line, the $2^N-1$ verify voltages corresponding to the $2^N-1$ levels of the $2^N$ levels.

In some implementations, each of the cache storage unit, the multipurpose storage unit, and the data storage units includes a latch.

In some implementations, the peripheral circuit is further configured to program a next select row of the rows of memory cells based on the next data page after programming the select row based on the current data page.

According to still another aspect of the present disclosure, a method for operating a memory device is provided. The memory device includes a plurality of rows of memory cells. N bits of a current data page are received. One of the N bits of the current data page is stored in one cache storage unit, and a respective one of the N bits of the current data page is stored in each of N−1 data storage units. Non-data page information is stored in one multipurpose storage unit. A select row of the rows of memory cells is programmed based on the current data page. The select row is sequentially verified until the Nth to last level of $2^N$ levels. N bits of a next data page are received. Each of the N bits of the next data page is sequentially stored in the cache storage unit after verifying at a respective one of the last N levels of the $2^N$ levels. One of the N bits of the next data page is stored in the multipurpose storage unit after verifying at the last level of the $2^N$ levels.

In some implementations, the respective one of the N bits of the current data page is stored in one of the data storage units before verifying at the (N−1)th to last level of the $2^N$ levels. In some implementations, a respective one of the N bits of the next data page is stored in the data storage unit after verifying at the (N−1)th to last level of the $2^N$ levels.

In some implementations, a next select row of the rows of memory cells is programmed based on the next data page.

In some implementations, the non-data page information includes a voltage level applied to the respective bit line.

In some implementations, each of the cache storage unit, the multipurpose storage unit, and the data storage units includes a latch.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
   an array of memory cells in a plurality of columns and a plurality of rows, each memory cell being configured to store a piece of N-bits data at one of $2^N$ levels, where N is an integer greater than 1;
   a plurality of word lines respectively coupled to rows of the memory cells;
   a plurality of bit lines respectively coupled to the columns of the memory cells; and
   a peripheral circuit coupled to the array of memory cells through the bit lines and the word lines and configured to program a select row of the rows of the memory cells based on a current data page, the peripheral circuit comprising a plurality of page buffer circuits respectively coupled to the bit lines, each page buffer circuit comprising:
      one cache storage unit configured to, in programming the select row based on the current data page, sequentially receive N bits of the current data page and N bits of a next data page, and sequentially store one of the N bits of the current data page and each of the N bits of the next data page;
      one multipurpose storage unit configured to, in programming the select row based on the current data page, sequentially store non-data page information and one of the N bits of the next data page; and
      N−1 data storage units each configured to, in programming the select row based on the current data page, store a respective one of the N bits of the current data page.

2. The memory device of claim 1, wherein the non-data page information comprises a voltage level applied to the respective bit line.

3. The memory device of claim 1, wherein to program the select row based on the current data page, the peripheral circuit is configured to sequentially verify the select row at $2^N-1$ levels of the $2^N$ levels.

4. The memory device of claim 3, wherein the cache storage unit is configured to:
   store the one of the N bits of the current data page before verifying at the Nth to last level of the $2^N$ levels; and
   sequentially store each of the N bits of the next data page after verifying at a respective one of the last N levels of the $2^N$ levels.

5. The memory device of claim 3, wherein the multipurpose storage unit is configured to:
   store the non-data page information before verifying at the last level of the $2^N$ levels; and
   store the one of the N bits of the next data page after verifying at the last level of the $2^N$ levels.

6. The memory device of claim 1, wherein at least one of the data storage units is configured to sequentially store the respective one of the N bits of the current data page and a respective one of the N bits of the next data page.

7. The memory device of claim 6, wherein one of the at least one of the data storage units is configured to:
   store the respective one of the N bits of the current data page before verifying at the (N−1)th to last level of the $2^N$ levels; and
   store the respective one of the N bits of the next data page after verifying at the (N−1)th to last level of the $2^N$ levels.

8. The memory device of claim 3, wherein the peripheral circuit further comprises a word line driver coupled to the word lines and configured to:
   apply a program voltage on a select word line of the word lines coupled to the select row; and
   sequentially apply $2^N-1$ verify voltages on the select word line, the $2^N-1$ verify voltages corresponding to the $2^N-1$ levels of the $2^N$ levels.

9. The memory device of claim 1, wherein each of the cache storage unit, the multipurpose storage unit, and the data storage units comprises a latch.

10. The memory device of claim 1, wherein the peripheral circuit is further configured to program a next select row of the rows of memory cells based on the next data page after programming the select row based on the current data page.

11. The memory device of claim 1, wherein the page buffer circuit comprises one cache latch, two data latches, one 3 bit line latch, and one sensing/program latch.

12. The memory device of claim 1, wherein the one cache storage unit comprises the one cache latch, the N−1 data storage units comprise the two data latches, and the multipurpose storage unit comprises the 3 bit line latch.

13. A system, comprising:
    a memory device configured to store data, the memory device comprising:
       an array of memory cells in a plurality of columns and a plurality of rows, each memory cell being configured to store a piece of N-bits data at one of $2^N$ levels, where N is an integer greater than 1;
       a plurality of word lines respectively coupled to rows of the memory cells;
       a plurality of bit lines respectively coupled to the columns of the memory cells; and
       a peripheral circuit coupled to the array of memory cells through the bit lines and the word lines and configured to program a select row of the rows of the memory cells based on a current data page, the peripheral circuit comprising a plurality of page buffer circuits respectively coupled to the bit lines, each page buffer circuit comprising:
          one cache storage unit configured to, in programming the select row based on the current data page, sequentially receive N bits of the current data page and N bits of a next data page, and sequentially store one of the N bits of the current data page and each of the N bits of the next data page;

one multipurpose storage unit configured to, in programming the select row based on the current data page, sequentially store non-data page information and one of the N bits of the next data page; and N−1 data storage units each configured to, in programming the select row based on the current data page, store a respective one of the N bits of the current data page; and a memory controller coupled to the memory device and configured to control the memory device.

14. The system of claim 13, wherein to program the select row based on the current data page, the peripheral circuit is configured to sequentially verify the select row at $2^N-1$ levels of the $2^N$ levels.

15. The system of claim 14, wherein the cache storage unit is configured to:

store the one of the N bits of the current data page before verifying the Nth to last level of the $2^N$ levels; and sequentially store each of the N bits of the next data page after verifying a respective one of the last N levels of the $2^N$ levels.

16. The system of claim 14, wherein the multipurpose storage unit is configured to:

store the non-data page information before verifying the last level of the $2^N$ levels; and store the one of the N bits of the next data page after verifying the last level of the $2^N$ levels.

17. A method for operating a memory device comprising a plurality of rows of memory cells, the method comprising:

receiving N bits of a current data page;

storing one of the N bits of the current data page in one cache storage unit and a respective one of the N bits of the current data page in each of N−1 data storage units;

storing non-data page information in one multipurpose storage unit;

programming a select row of the rows of memory cells based on the current data page;

sequentially verifying the select row until the Nth to last level of $2^N$ levels;

receiving N bits of a next data page;

sequentially storing each of the N bits of the next data page in the cache storage unit after verifying at a respective one of the last N levels of the $2^N$ levels; and storing one of the N bits of the next data page in the multipurpose storage unit after verifying at the last level of the $2^N$ levels.

18. The method of claim 17, further comprising:

storing the respective one of the N bits of the current data page in one of the data storage units before verifying at the (N−1)th to last level of the $2^N$ levels; and storing a respective one of the N bits of the next data page in the data storage unit after verifying at the (N−1)th to last level of the $2^N$ levels.

19. The method of claim 17, further comprising programming a next select row of the rows of memory cells based on the next data page.

20. The method of claim 17, wherein the non-data page information comprises a voltage level applied to the respective bit line.

* * * * *